United States Patent [19]
Diffenderfer et al.

[11] Patent Number: 5,872,397
[45] Date of Patent: Feb. 16, 1999

[54] SEMICONDUCTOR DEVICE PACKAGE INCLUDING A THICK INTEGRATED CIRCUIT CHIP STACK

[75] Inventors: Steven Joel Diffenderfer, Deposit; Stephen Wesley MacQuarrie, Vestal, both of N.Y.

[73] Assignee: International Business Machines Corporation, Armonk, N.Y.

[21] Appl. No.: 768,363

[22] Filed: Dec. 17, 1996

Related U.S. Application Data

[60] Provisional application No. 60/020,306 Jun. 24, 1996.
[51] Int. Cl.⁶ ................................................. H01L 23/34
[52] U.S. Cl. ........................ 257/723; 257/777; 257/731; 257/684
[58] Field of Search ................................. 257/723, 724, 257/777, 731, 778, 782, 684

[56] References Cited

U.S. PATENT DOCUMENTS

| | | | |
|---|---|---|---|
| 4,706,166 | 11/1987 | Go | 361/771 |
| 4,850,105 | 7/1989 | Nakajima et al. | 29/841 |
| 5,262,927 | 11/1993 | Chia et al. | 257/666 |

FOREIGN PATENT DOCUMENTS

| | | | |
|---|---|---|---|
| 0461939 | 12/1991 | European Pat. Off. | 257/723 |
| 486 829 | 5/1992 | European Pat. Off. | |
| 637 839 | 2/1995 | European Pat. Off. | |
| 08031869 | 2/1996 | European Pat. Off. | |
| 0 712 157 | 5/1996 | European Pat. Off. | |
| 63-52461 | 3/1988 | Japan | 257/724 |
| 4-28260 | 1/1992 | Japan | 257/723 |
| 6163802 | 6/1994 | Japan | 257/723 |
| WO95/29506 | 11/1995 | WIPO | |

*Primary Examiner*—Olik Chaudhuri
*Assistant Examiner*—Nat Kelley
*Attorney, Agent, or Firm*—Michael N. Meller

[57] ABSTRACT

A semiconductor device package and method includes a thick, integrated circuit chip stack having a substantially planar bottom surface with a plurality of terminals. A carrier substrate is provided, also having a substantially planar surface, and being adapted to mount the chip stack. The substrate has a plurality of terminals and may preferably be made of a metallized ceramic. The terminals of the chip stack are adapted to be connected to the terminals of the substrate. Means are provided for mounting the chip stack on the substrate, as well as means for making electrical connections between the terminals of the chip stack and the terminals of the substrate. Finally, encapsulating means are used for supporting and maintaining the chip stack mounted on the carrier substrate. J leads connect the substrate to a circuit card.

3 Claims, 3 Drawing Sheets

SEMICONDUCTOR DEVICE PACKAGE INCLUDING A THICK INTEGRATED CIRCUIT CHIP STACK

TECHNICAL FIELD

The present invention relates to a semiconductor device package and method. More particularly, the present invention relates to a semiconductor device package and a method for making interconnections between a multi-layer "Chip Stack" to a printed circuitboard in a ceramic package.

Integrated circuits as fabricated on chips come in several different formats. These chips can be arranged in a "chip stack" and must be interconnected to a printed circuit card. Such stack can be much thicker than the common integrated circuit chip and comes in different heights.

BACKGROUND OF THE INVENTION

Various methods exist for packaging integrated circuit chips and mounting them on a printed circuit board. With a wirebonding technique, the integrated circuit chip may be encapsulated, that is, as a molded plastic package or completely enclosed as a ceramic package. The chip is provided with wire-bonding pads onto which fine wires are bonded, which, in turn, have their opposite ends bonded to inner lead bond (ILB) pads contained in the package to be encapsulated. Thereafter, the chip and an end of each ILB are encapsulated in molding compound or enclosed in ceramic, with the outer lead (OL) exposed for further connections.

The integrated circuit chip's package very often has leads which are formed downwardly so that they may be soldered to the printed circuit board. In some cases, the integrated circuit chip's package plugs into a socket that makes the electrical connections on the printed circuit board.

Three-dimensional packaging techniques have been developed to increase such items as computer memory density. This can be done by stacking layers of ceramic containing multiple memory chips and stacked memory packages, such as in high-end computer memory subsystems. Such packaging methods have been carried out by mounting chips at an angle to a memory or a processor board in individual packages, or on a memory module known as a single-in-line memory module (SIMM). A dual-in-line package (DIP) is an example of such a memory package. The purpose is to put more memory into less volume. For a discussion of a three-dimensional memory cube system, see, "Evaluation of a Three-Dimensional Memory Cube System" in *IEEE Transactions on Components, Hybrids, and Manufacturing Technology*, Volume 16, No. 8, December 1993, pp. 1006–1011, Claude L. Bertin, David J. Perlman, and Stuart N. Shanken.

This article indicates how a thin film metal layer is added to each chip surface to transfer signal and power input and output from the chip bond pads to the chip edges. The chips may be stacked and a right-angle joint is formed between the end of a transfer tab for transferring signals in and out of each chip. Thus, it is possible to use electrical probing or to provide further interconnections on the face of the cube of the chip stack.

Accordingly, many problems exist when attempting to achieve a high density in a relatively small space. Various boundary conditions are presented when confronted with the problem of interconnecting different chip-stack heights to the printed circuit board. Such conditions include:

(1) minimum printed circuit card footprint;
(2) low cost for the package and the card attachment;
(3) there must be an opportunity for the provision of heat removal;
(4) the reliability of the devices on the silicon integrated circuit chip must be maintained;
(5) the chip stack must be protected during the bonding and assembling, the testing, and the use in the final assembly;
(6) if possible, a standard card footprint developed by the Joint Electronic Devices Engineering Council (JEDEC) should be used;
(7) the signal lines, power lines, and/or ground lines should be interconnected on the package's substrate, wherever possible; and
(8) compatibility should be maintained, when possible, with the appropriate test and burn in equipment.

SUMMARY OF THE INVENTION

In order to solve the high density stacking problem, and meet as many of the established boundary conditions as possible, the present invention provides a semiconductor device package which includes a thick, integrated circuit chip stack having a substantially planar bottom surface and a plurality of terminals. A metallized ceramic (MC) carrier substrate is provided, having a substantially planar surface adapted to mount the chip stack and having a plurality of terminals adapted to be electrically connected to the terminals of the chip stack. Means are provided for mounting the chip stack to the substrate. Means are further provided for making electrical connections between the terminals of the chip stack and the terminals of the substrate. Finally, when desired, encapsulating means for supporting and maintaining the chip stack mounted to the carrier substrate must be provided.

In a preferred embodiment of the present invention, the semiconductor package includes a chip stack with a bottom surface having a preselected physical configuration. The carrier substrate has a cutout portion corresponding substantially to the physical configuration of the chip stack's bottom surface. In this way, the chip stack may be mounted in the cutout portion in a substantially coplanar arrangement, with the bottom surface of the chip stack being coplanar with the bottom surface of the substrate.

In a further embodiment of the present invention, solder-laden J lead clips can be coupled to the substrate to permit further electrical connection to the printed circuit board (PCB).

In further embodiments, other types of connections may be used such as pin-in-hole (PIH), card edge Zero Insertion Force (ZIF), gull wing and lead frame.

In yet another preferred embodiment of the present invention, the carrier is a metallized ceramic substrate, and the electrically connecting means include solder pads on the substrate for connection to the terminals on the chip stack.

In a method incorporating the principles of the present invention, the semiconductor package is assembled utilizing the steps of forming a thick integrated circuit chip stack having a substantially planar bottom surface with a plurality of terminals, mounting the chip stack on a carrier substrate having a substantially planar surface and having a plurality of terminals adapted to be electrically connected to the terminals of the chip stack, making electrical connections between the terminals of the chip stack and the terminals of the substrate, and encapsulating the chip stack and the carrier substrate to support and maintain the chip stack mounted on the carrier substrate, and to provide protection from the environment.

In a preferred method, the carrier substrate has a cutout portion and during the step of mounting the chip stack on the carrier substrate, the bottom surface of the chip stack protrudes through the cutout portion of the carrier substrate.

In a further preferred method, the carrier substrate is a metallized ceramic substrate. Solder is deposited on the substrate, whereby the mounting of the chip stack on the substrate and the making of electrical connections between the terminals of the chip stack and the terminals of the substrate is accomplished via the deposited solder.

DESCRIPTION OF THE INVENTION

Figure 1:
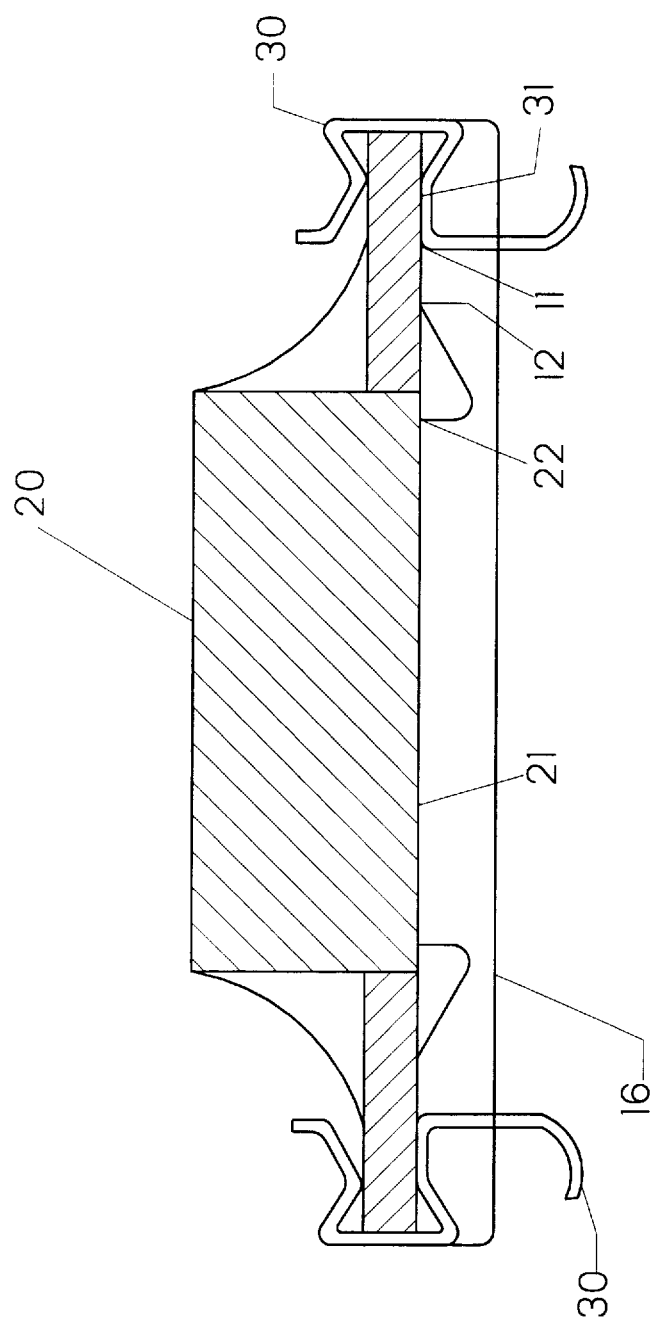
FIG. 1 is a cross-sectional view of a wire-bond metallized ceramic (MC) embodiment of the present invention.

Referring to the drawings and, more particularly to FIG. 1, a metallized substrate 10 is provided, having a cutout portion into which a chip stack 20 is mounted. The bottom portion of the chip stack 20, as shown in FIG. 1, has a preselected configuration which corresponds to the cutout portion of the ceramic substrate 10. It can be seen that the bottom surface 21 of the chip stack 20 protrudes into and is substantially coplanar with the bottom surface 11 of the ceramic substrate 10.

The substrate 10 can be patterned (circuitized) with a photolithographic process and plated in the standard wire-bond flat pack (WBFP) construction. That is, the construction and manufacturing processes for providing the electrical connections on the surfaces of the substrate 10 are done in a conventional manner, and need not be detailed at this time. For example, see Williams, M. E., et al., "Enabling Fine-Pitch Wire Bonding Through the Use of Thin Film Metal on Ceramic," *Proceedings of the* 1995 *International Symposiwn on Microelectronics*, Oct. 24–26, 1995, Los Angeles, Calif., pp. 290–295.

Note that the terminals 22 on the bottom surface of the chip stack 20 may be connected to the terminals 12 on the bottom surface of the substrate 10, as viewed in FIG. 1. It can be seen that this design is not limited in height, so that the chip stack may be made any height desired to fit into the physical dimensions of the particular requirements. Since the terminals 22 of the chip stack 20 and the terminals 12 of the substrate 10 are in substantially the same plane, the wire-bonding equipment for making the connections between these terminals can make bonds to the chip stack and the substrate in the same plane.

The procedures for such wire bonding can be of the type described by Christian Val in "The 3D Interconnection—An Enhanced Densification Approach with Bare Chips," Eighth IEMT: International Electronics Manufacturing Conference, IEEE No. CH2833-2/90/0000-0082, 1990, pp 82–91.

The wire bond 15 connects the terminals 22 to the terminals 12. After the chip stack 20 has been assembled by mounting on the substrate 10 and the desired interconnections made between the chip stack and the substrate, the package can be protected with encapsulants 16 and 17, as shown. Again, the encapsulating process and the material are well-known and need not be specifically discussed at this time.

The advantages of the preferred embodiment, shown in FIG. 1, are manyfold. Note that the chip stack may be mounted through the ceramic, so that the wire-bond process is a simple one for connecting the pads on the chip stack to the terminals of the substrate. The arrangement can stay substantially fixed and a taller chip stack 20 can be accommodated since there is unlimited height in this version of the present invention. A heat sink can be attached directly to the top of the uppermost chip stack. Even without such heat sink, there would be good heat dissipation due to the exposure of the chip stack to the air in the stacked position. There is no metal cap in this arrangement to limit the height of the integrated circuit package.

J lead clips 30 may be connected to the substrate 10 by a solder joint 31 to permit further interconnection to other electrical devices, such as a circuit card.

Figure 6:
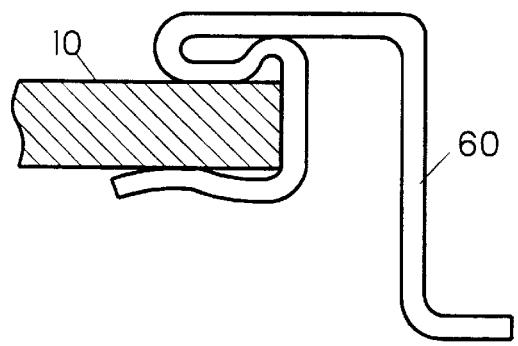
FIG. 6 is a cross-sectional view of a gullwing connector.

The design shown in FIG. 1 is very flexible and can incorporate a variety of options. Thus, gullwing leads may be used, as well as J leads. Referring to FIG. 6, a gullwing connector 60 is shown connecting the substrate 10.

It is also possible to dispense additional epoxy 17 to coat the metal on the side of the chip stack, when desired, and to match the stack wire-bond pitch to the ceramic carrier pad pitch to simplify assembly. There are also, with this arrangement, expandable lead counts and overmold plastic encapsulation is available.

A plastic, metal, or ceramic cap, can be used in place of encapsulation. Rather than using a ceramic substrate, it is possible to use an organic carrier, such as an FR4 printed circuit board. A multilayer ceramic (MLC) substrate or a "flexible" base (such as stamped metal) may also be used in place of the MC substrate. The chip stack to ceramic geometry can be flush, underflush, or "overflush," as needed for optimizing the wire bond process. The process can also be compatible with cutouts provided by dry pressing, laser cutting, or other ceramic fabrication techniques.

The arrangement shown in FIG. 1 satisfies substantially all of the eight boundary conditions set forth above. The package provides a reliable chip-to-card interconnect arrangement for a "taller than typical" chip or chip stack. The package shown in FIG. 1 also maintains reliability of silicon by protecting the chip stack during the bonding and assembly, the test, the burn-in, the card assembly, as well as the testing and use in final assembly.

As mentioned above, the package arrangement can be extended to a variety of different chip-stack heights. Also, the substrate allows interconnection of signals, power, and ground connections. The arrangement may interconnect with the existing stack without modifying such stack.

The arrangement shown in FIG. 1 may meet the JEDEC or de facto card footprint standard. As mentioned above, this arrangement provides an opportunity for heat removal by means of a bonded heat sink on the top or on the side of the stack. The technique shown in FIG. 1 is expandable to different industry formats, such as the SIMM, with ceramic to ceramic or ceramic stack to organic, such as in the FR4, wire-bond connections. Other card connections, such as pin-in-hole (PIH), card edge Zero Insertion Force (ZIF) connector, and lead frame, are also possible.

Figure 3:
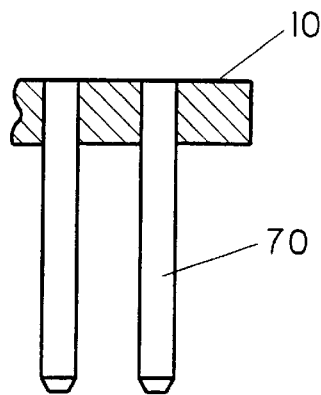
FIG. 3 is a cross-sectional view of a pin-in-hole connector.

Referring to FIG. 3, a PIH connector is shown having pins 70 connected to the substrate 10.

Figure 4:
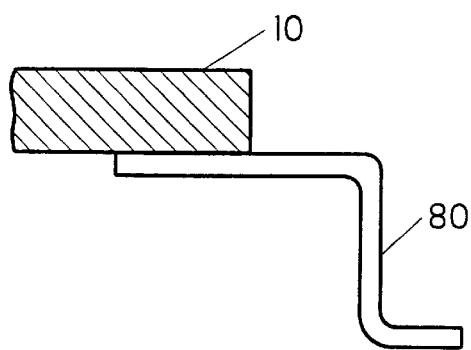
FIG. 4 is a cross-sectional view of a lead-frame connector.
Figure 5:
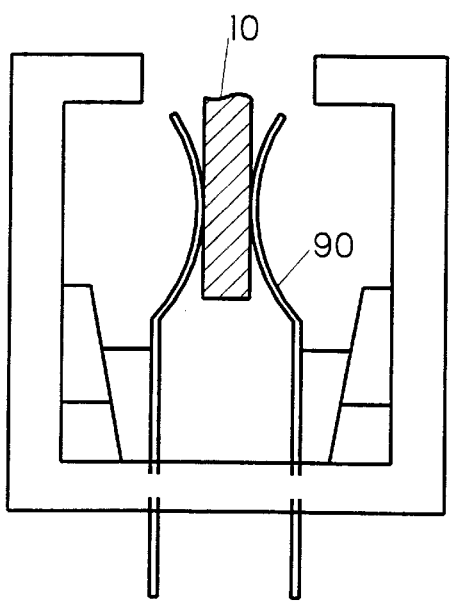
FIG. 5 is a cross-sectional view of a Zero Insertion Force connector.

In FIG. 4 is shown a lead frame connector 80 connected to the substrate 10, while in FIG. 5, a ZIF connector 90 is shown connected to the substrate 10. FIGS. 3–6 clearly illustrate the flexibility of the design shown in FIG. 1.

Figure 2:
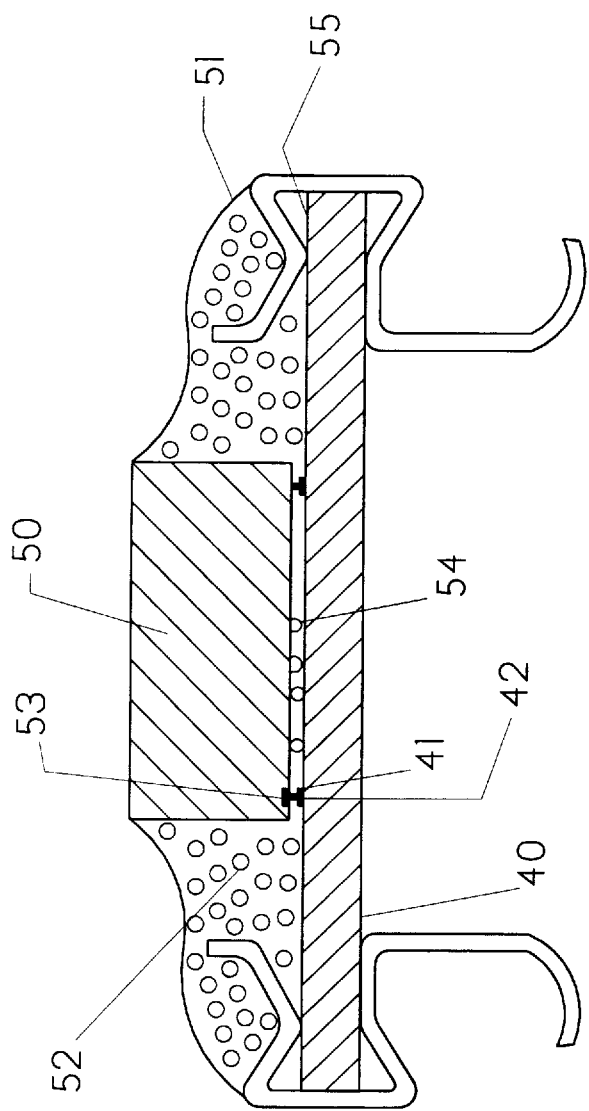
FIG. 2 is a cross-sectional view of a ceramic-soldered-to-ceramic version of the present invention.

Referring now to FIG. 2, a second preferred embodiment of the semiconductor device package incorporating the principles of the present invention is shown. As mentioned above, this embodiment is a ceramic-soldered-to-ceramic version of the package, and is also based on metallized ceramic substrate processing. In this arrangement, the ceramic substrate 40 has no cutout portion, but has a substantially planar upper and bottom surface.

The chip stack 50 is mounted on the substrate 40 by using the flip-chip-like chip connection. This connection utilizes solder pads 41 meeting with solder-wettable terminals 53 on the chip stack. The solder is dispensed on the substrate where it meets with the terminal 53 of the stack 50.

The screened solder can be near-pear-shaped to allow processing on existing solder-dispensing equipment, yet it can be matched to a tight-knit pad pattern on the existing stack. The solder is provided on the MC substrate rather than the chip stack. This permits the chip-stacking process the freedom to gang process stacks 50 without interspersed layers of solder. Solder can be plated onto the MC substrate instead of screening. Solder injection onto the MC substrate can also be used.

Similarly, solder on the ceramic is desirable because separating the ganged chip stacks and adding solder to one stack at a time will not be cost effective. The chip-stack-to-carrier assembly processes used are similar to the bond and assembly process currently practiced for the controlled-collapse-chip-connection (C4) or flip-chip, Flat Pack (C4FP). These processes are used to connect the stack to the ceramic substrate 40. J lead clips 51 are provided to make contact between the substrate and the printed circuit card, as before.

J lead clips 51 may be connected to the substrate 10 by a solder joint 55 to permit further interconnection to other electrical devices, such as a circuit card. Also, the overall package is again protected by encapsulant 52 in the conventional manner. An underfill epoxy or similar material 54 can be dispensed under the stack.

The metallized ceramic substrate 40 is provided with a circuitry pattern using current metallized ceramic (MC) photolithographic processes. This version of FIG. 2 has additional wiring flexibility when compared to the wire-bond version of FIG. 1. Since there is no cutout in the embodiment of FIG. 2, it is possible to provide additional interconnecting lines in the area under the stack. These electrical lines can be used to jumper signal lines, power buses, and ground lines. The package will provide a reliable chip-to-card interconnect method for the chip stack.

Similar to the wire-bond embodiment, the embodiment of FIG. 2 is extendable to a variety of heights of chip stacks. This design concept is also flexible and provides a variety of options which can also be incorporated. This semiconductor device package, arranged in the manner illustrated in FIG. 2, provides a reliable chip-to-card interconnect arrangement for the "taller than typical" chip or chip stack. This package also maintains the reliability of the device by protecting the chip stack during the bond and assembly process, the test, burn in, card assembly, testing, and use in the final assembly. The solder, as noted above, is provided with the ceramic rather than with the chip stack. This allows the chip-stacking process the freedom to stack chips without adding solder to the stack. This would be very desirable to a chip-stack manufacturer.

The ceramic-to-ceramic interconnection by means of solder pads will have a significantly reduced CTE mismatch; therefore, the assembly will have a higher reliability than an assembly with a silicon-to-ceramic interconnect. The embodiment of FIG. 2 has additional wiring flexibility compared to the embodiment of FIG. 1, as indicated above, since there is no cutout and it permits more interconnecting lines to be run under the stack area. The arrangement of FIG. 2 can interconnect existing stacks without modifying such stacks. The technique used in the embodiment of FIG. 2 is expandable to the industry format, such as the SIMM, with ceramic-on-ceramic or ceramic stack on organic, such as FR4. MLC or stamped metal may be used in place of MC. The embodiment of FIG. 2 may also meet the JEDEC or de facto card footprint standard. An electrically conductive adhesive may be used in place of solder.

Gull Wing, PIH, lead frame, or card edge ZIF may be used instead of J leads. FIGS. 3–6 again illustrate the flexibility of this design wherein the substrate 40 of FIG. 2 may be substituted for the substrate 10 shown in these Figures. The FIG. 2 embodiment makes transition to packaging C4 stacks straightforward. The embodiment of FIG. 2 also provides good surface area for heat removal by means of a bonded heat sink either on top of or on the side of the stack.

While the present invention has been described with respect to two specific embodiments, it is clear that these are examples provided by way of explanation only, and not by way of limitation. Thus, the invention is not intended to be limited in scope, except as by the following claims.

What is claimed is:

1. A semiconductor package comprising:

a thick integrated circuit chip stack having at least three integrated circuit chips, said stack having a substantially planar bottom surface with a plurality of terminals;

a carrier substrate having a substantially planar surface adapted to mount said chip stack and having a plurality of terminals adapted to be electrically connected to said terminals of said chip stack;

means for mounting said chip stack on said substrate;

means for making electrical connections between said terminals of said chip stack and said terminals of said substrate; and encapsulating means for supporting and maintaining said chip stack mounted on said carrier substrate, and providing protection from the environment, wherein said bottom surface of said chip stack has a preselected physical configuration and said carrier substrate has a cutout portion corresponding substantially to said physical configuration of said chip stack bottom surface whereby said chip stack is mounted in said cutout portion with said bottom surface of said chip stack substantially coplanar with said surface of said substrate.

2. A semiconductor package comprising:

a thick integrated circuit chip stack having at least three integrated circuit chips, said stack having a substantially planar bottom surface with a plurality of terminals;

a carrier substrate having a substantially planar surface adated to mount said chip stack and having a plurality of terminals adapted to be electrically connected to said terminals of said chip stack;

means for mounting said chip stack on said substrate;

means for making electrical connections between said terminals of said chip stack and said terminals of said substrate;

encapsulating means for supporting and maintaining said chip stack mounted on said carrier substrate, and providing protection from the environment, wherein said bottom surface of said chip stack has a preselected physical configuration and said carrier substrate has a cutout portion corresponding substantially to said physical configuration of said chip stack bottom surface where said chip stack is mounted in said cutout portion with said bottom surface of said chip stack substantially coplannar with said surface of said substrate, wherein wire bonds are coupled to said substrate to permit further electrical connection to said chip stack.

3. A semiconductor package comprising:

a thick integrated circuit chip stack having at least three integrated circuit chips, said stack having a substantially planar bottom surface with a plurality of terminals;

a carrier substrate having a substantially planar surface adapted to mount said chip stack and having a plurality of terminals adapted to be electrically connected to said terminals of said chip stack;

means for mounting said chip stack on said substrate;

means for making electrical connections between said terminals of said chip stack and said terminals of said substrate;

encapsulating means for supporting and maintaining said chip stack mounted on said carrier substrate and providing protection from the environment, further including electrical coupling means adapted for being positioned on or against said carrier substrate and for directly electrically coupling said carrier substrate to a next level of assembly, wherein said electrical coupling means includes at least one electrically conductive member adapted for being electrically coupled to a respective one of said terminals on said carrier substrate; and wherein said electrically conductive member includes an externally clamped J lead clip.

* * * * *

UNITED STATES PATENT AND TRADEMARK OFFICE
CERTIFICATE OF CORRECTION

PATENT NO. : 5,872,397
DATED : Feb. 16, 1999
INVENTOR(S) : Diffenderfer et al

It is certified that error appears in the above-indentified patent and that said Letters Patent is hereby corrected as shown below:

Column 6, line 58 - delete "adated" and insert --adapted--.

Signed and Sealed this

Seventh Day of September, 1999

Attest:

Q. TODD DICKINSON

*Attesting Officer*   *Acting Commissioner of Patents and Trademarks*